(12) United States Patent
Hollaender et al.

(10) Patent No.: US 12,010,790 B2
(45) Date of Patent: Jun. 11, 2024

(54) HIGH-FREQUENCY CIRCUIT INCLUDING A CIRCUIT BOARD AND A WAVEGUIDE STRUCTURE

(71) Applicant: Robert Bosch GmbH, Stuttgart (DE)

(72) Inventors: Christian Hollaender, Waldbronn (DE); Klaus Baur, Mietingen (DE); Gustav Klett, Moessingen (DE); Klaus Voigtlaender, Wangen (DE); Michael Schoor, Stuttgart (DE); Ronny Ludwig, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 194 days.

(21) Appl. No.: 17/504,401

(22) Filed: Oct. 18, 2021

(65) Prior Publication Data

US 2022/0140488 A1 May 5, 2022

(30) Foreign Application Priority Data

Oct. 29, 2020 (DE) ...................... 10 2020 213 582.7

(51) Int. Cl.
*H05K 1/02* (2006.01)
*H01Q 1/52* (2006.01)
*H01Q 21/06* (2006.01)
*H01Q 23/00* (2006.01)

(52) U.S. Cl.
CPC ........... *H05K 1/0243* (2013.01); *H01Q 1/526* (2013.01); *H01Q 21/064* (2013.01); *H01Q 23/00* (2013.01); *H05K 2201/09985* (2020.08); *H05K 2201/10098* (2013.01); *H05K 2201/1059* (2013.01)

(58) Field of Classification Search
CPC .......... H01Q 1/02; H01Q 1/12; H01Q 1/1207; H01Q 1/1221; H01Q 1/52; H01Q 1/526; H01Q 21/064; H01Q 21/0075; H01Q 23/00; H01P 1/207; H05K 1/0243; H05K 1/0251; H05K 1/182; H05K 1/184; H05K 1/0207; H05K 1/0218; H05K 1/0237; H05K 1/0204; H05K 3/308; H05K 2201/1059; H05K 2201/10098; H05K 2201/09985

See application file for complete search history.

(56) References Cited

U.S. PATENT DOCUMENTS

| | | | | |
|---|---|---|---|---|
| 2014/0285393 | A1* | 9/2014 | Biglarbegian | ..... H01Q 21/0075 333/260 |
| 2020/0403298 | A1* | 12/2020 | Vincent | ................... H01L 23/66 |
| 2021/0225719 | A1* | 7/2021 | Seler | ....................... H01L 24/20 |

* cited by examiner

*Primary Examiner* — Robert Karacsony
(74) *Attorney, Agent, or Firm* — NORTON ROSE FULBRIGHT US LLP; Gerard A. Messina

(57) ABSTRACT

A high-frequency circuit including a circuit board which bears at least one electronic component and a conductor structure, and including a waveguide structure manufactured separately from the circuit board. The waveguide structure is positioned on the circuit board in such a way that high-frequency signals are transferable between the conductor structure on the circuit board and the waveguide structure. The waveguide structure is held with the aid of press-fit pins on the circuit board.

15 Claims, 6 Drawing Sheets

HIGH-FREQUENCY CIRCUIT INCLUDING A CIRCUIT BOARD AND A WAVEGUIDE STRUCTURE

CROSS REFERENCE

The present application claims the benefit under 35 U.S.C. § 119 of German Patent Application No. DE 102020213582.7 filed on Oct. 29, 2020, which is expressly incorporated herein by reference in its entirety.

FIELD

The present invention relates to a high-frequency circuit including a circuit board which carries at least one electronic component and a conductor structure, and including a waveguide structure manufactured separately from the circuit board, which is positioned on the circuit board in such a way that high-frequency signals are transferable between the conductor structure on the circuit board and the waveguide structure.

In particular, the present invention relates to a high-frequency circuit which is part of a radar sensor for motor vehicles.

BACKGROUND INFORMATION

In motor vehicles, radar sensors are used in conjunction with driver assistance systems or safety systems such as systems for adaptive cruise control or for collision warning to detect the traffic surroundings. In order that the most complete possible picture of the traffic situation is obtained, the radar sensors are to have a broad detection range in the azimuth in particular. Radar sensors are often used for this purpose, which include a high-frequency circuit of the type mentioned at the outset and in which the waveguide structure forms waveguide antennas, using which the radar signals are emitted and/or received.

The conductor structure on the circuit board forms feed points, so-called launchers, via which the high-frequency signals may be coupled into the waveguide structure or, vice versa, received radar signals may be coupled into the conductor structure and transferred for signal evaluation to the electronic component. For perfect signal transfer it is essential that the waveguide structure is positioned very precisely in relation to the launcher.

In some conventional high-frequency circuits of this type, the waveguide structure, for example, a molded part made of plastic including metallized walls, is held with the aid of screw connections on the circuit board. This has the disadvantage that the heads of the fastening screws occupy a relatively large area on the side of the circuit board facing away from the waveguide structure, which is then no longer available for electronic components and strip conductors.

One conventional alternative is to use adhesive bonds instead of screw connections. The occupied space on the circuit board is thus reduced, but the manufacturing process is more complex, particularly because the adhesives have to be cured at high temperatures. Heat chambers are required for this purpose, in which the high-frequency circuits have a relatively long dwell time, so that a high level of productivity is only achievable with high facility costs.

SUMMARY

An object of the present invention is to enable precise positioning and secure fastening of the waveguide structure on the circuit board with low manufacturing expenditure.

This object may be achieved according to the present invention in that the waveguide structure is held on the circuit board with the aid of press-fit pins.

The pressing-fit technology with the aid of press-fit pins has already been used successfully for establishing electrical connections between the circuit board and electrical plugs. In accordance with an example embodiment of the present invention, when this technology is used for installing waveguide structures on the circuit board, the position of the waveguide structure in relation to the launchers is thus predefined by the position of press-fit sleeves formed in the circuit board, into which the press-fit pins situated at the waveguide structure are then accurately pressed. A more secure hold of the waveguide structure on the circuit board is achieved by the friction lock of the press-fit pins in the sleeves and possibly by diffusion processes, which produce an intermetallic connection between the press-fit pins and the metallic linings of the sleeves, without time-consuming and costly measures being required to cure adhesives.

Advantageous embodiments and refinements of the present invention are described herein.

In one specific embodiment of the present invention, the waveguide structure is formed by molded bodies made of plastic, in which channels are formed in accordance with the desired course of the waveguide sections. The channels are open to a surface of the molded body so that problem-free demolding is possible during the manufacturing of the molded body. To form the waveguide structure, the walls of the channels are metallized and the channels are closed by a sheet-metal plate on the open side. The press-fit pins may then be manufactured easily in that oblong strips are stamped out of the sheet-metal plate and bent at right angles, the thickness of the sheet-metal plate and the width of the strips being selected in such a way that they are adapted to the dimensions of the press-fit sleeves in the circuit board.

The metal plate which forms the press-fit pins may be located on the side of the waveguide structure facing toward the circuit board or optionally also on the side facing away from the circuit board. In the latter case, the waveguide structure may form passages which are penetrated by some of the press-fit pins, so that a largely uniform distribution of the press-fit pins over the surface of the circuit board is achieved.

The waveguide structure typically forms coupling domes including coupling channels, which extend perpendicularly to the plane of the circuit board and are open toward the launchers on the circuit board. In one specific embodiment, the press-fit pins are pressed sufficiently deep into the sleeves in the circuit board that the coupling domes rest flush against the circuit board. In this way, dimensional tolerances are reduced to a minimum.

The sheet metal which forms the press-fit pins may also assume further functions in addition to the function of the mechanical fastening and positioning of the waveguide structure. For example, the sheet-metal plate may be part of an EMC shield for the electronic components on the circuit board. Furthermore, the sheet-metal plate may also be used for cooling the electronic components due to its good thermal conductivity.

The launchers on the circuit board may be enclosed by a conductive layer, by which the air gap between the circuit board and the end of the coupling dome is completely closed electrically. This conductive layer may also optionally be formed by a conductive adhesive which at the same time contributes to the mechanical fastening of the waveguide structure on the circuit board.

In another specific embodiment of the present invention, the circuit board may be elastically pre-tensioned against the ends of the coupling domes, in particular in the area of the coupling domes.

Exemplary embodiments of the present invention are explained in greater detail hereinafter on the basis of the figures.

DETAILED DESCRIPTION OF EXAMPLE EMBODIMENTS

Figure 1:
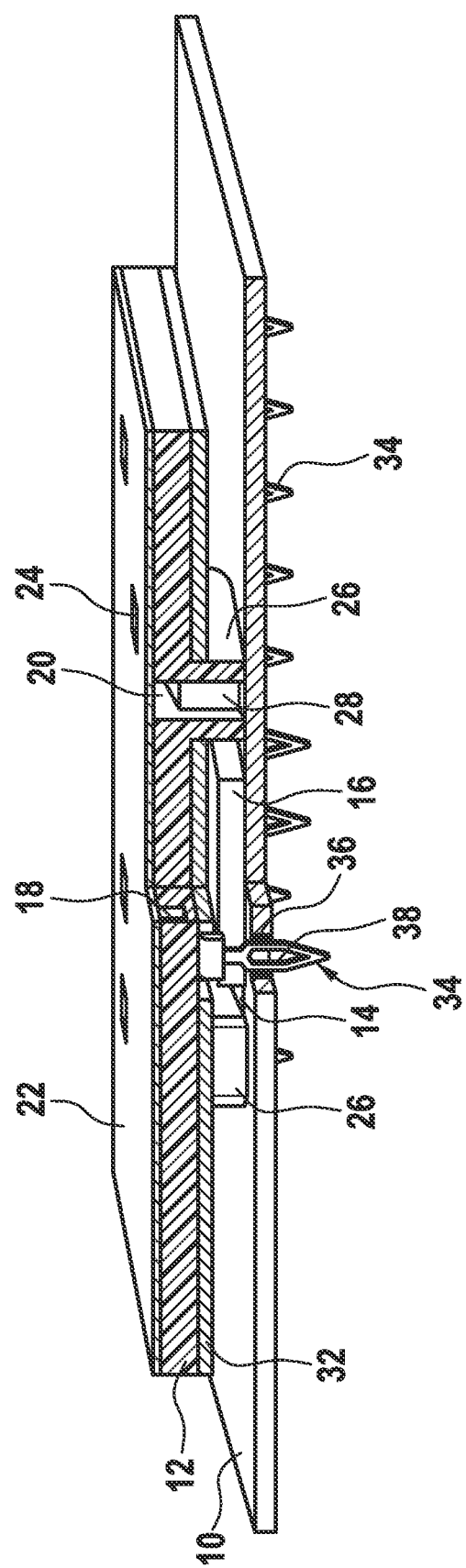
FIG. 1 shows a perspective, partially cutaway view of a high-frequency circuit according to one exemplary embodiment of the present invention.

FIG. 1 shows an example of a high-frequency circuit including a circuit board 10 and a waveguide structure 12, which in this example forms a waveguide antenna for a radar sensor. Circuit board 10 bears on its surface an electrical conductor structure 14, for example, microstrip lines, and at least one electronic component 16, for example, an MMIC (monolithic microwave integrated circuit) for generating frequency-modulated radar signals which are then emitted via the waveguide antenna, and for receiving and further processing the radar echoes of located objects.

Waveguide structure 12 is formed by a block made of plastic which forms channels 18, 20 including metallized side walls. The channels are enclosed on their entire circumference by electrically conductive surfaces and are used as waveguides for passing on microwave signals. In the example shown in FIG. 1, the depth of channels 18, 20 is less than the thickness of the plastic block, and the bottom of each of channels 18, 20 is formed by a metallized wall of the plastic block. On the upper side, channels 18, 20 are closed by a metal plate 22, in which emission openings 24 for emitting the microwave radiation are formed at certain points of the waveguide.

Plastic block 12 of the waveguide structure forms coupling domes 26 at certain points, which project in the direction of circuit board 10 and each delimit a vertical coupling channel 28, which is part of the waveguide network. So-called launchers 30 (see FIG. 2) are formed on circuit board 10 within the cross section of this coupling channel 28 and precisely centered on the coupling channel, which are connected via waveguide structure 14 to component 16 and via which the microwave signal generated in component 16 is coupled into the waveguide antenna.

In FIG. 1, the plastic block which forms waveguide structure 12 is fixedly situated on a lower metal plate 32, which is in turn fastened with the aid of press-fit pins 34 on circuit board 10. Press-fit pins 34 are each pressed into a metallic sleeve 36 which penetrates circuit board 10. The waveguide structure is thus precisely positioned in the plane of circuit board 10. Coupling domes 26 are used as spacers by which the distance between waveguide structure 12 and circuit board 10 is also precisely defined.

Press-fit pins 34 are situated in the example shown on the edge of metal plate 32 and are formed in one piece from the material of this metal plate. During the manufacturing, metal plate 32 is stamped out of a sheet-metal blank so that sheet-metal strips which later form press-fit pins 34 originate from the edge of the main part of the metal plate. These sheet-metal strips each have at the end the desired shape of press-fit pins 34 having a width and a thickness which are adapted to the dimensions of sleeves 36, and including an eye 38 which permits the pressing in force to be metered precisely. The sheet-metal strips are then each bent by 90° so that the press-fit pins extend at right angles to the plane of sheet-metal plate 32.

Sleeves 36 may be connected to a ground conductor of conductor structure 14, so that sheet-metal plate 32 is kept at ground potential.

While in the example shown, press-fit pins 34 are only formed on two parallel edges of sheet-metal plate 32, an embodiment variant is also conceivable in which the press-fit pins are also situated on the other two edges of the sheet-metal plate. Even more accurate positioning of waveguide structure 12 in relation to circuit board 10 may thus be achieved if needed.

Furthermore, one specific embodiment is conceivable in which waveguide structure 12 is only formed by individual "islands" made of plastic which form the side walls of channels 18, 20 and are injection molded on sheet-metal plate 32. The bottom of channels 18, 20 is formed in this case by electrically conductive sheet-metal plate 32.

Figure 2:
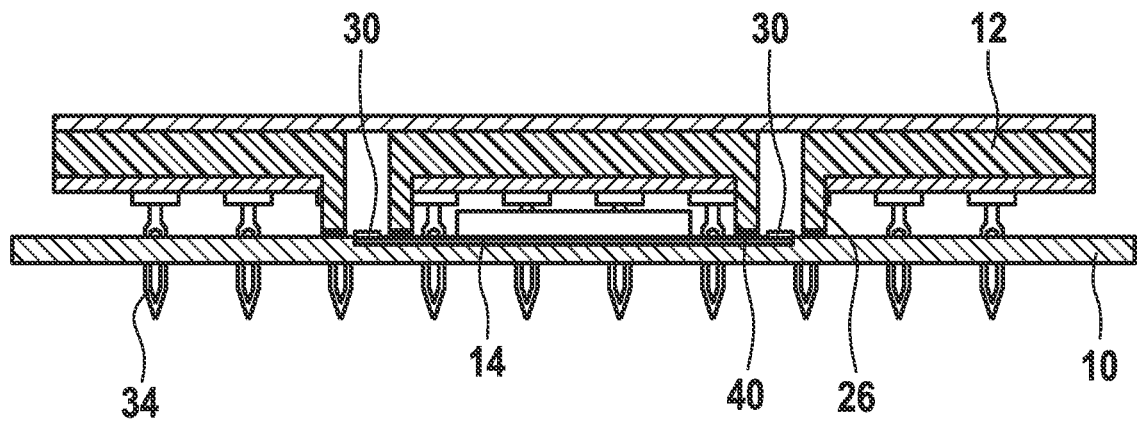
FIG. 2 shows a section through a high-frequency circuit according to one exemplary embodiment of the present invention.

FIG. 2 shows a section through a high-frequency circuit which has the same fundamental structure as in FIG. 1. However, in place of each coupling dome 26, an annular metallized area 40 is formed here on the surface of circuit board 10, which is congruent with the outline of coupling dome 26 and encloses launchers 30 with spacing. In this way, the air gap between circuit board 10 and coupling dome 26 which forms coupling channel 28 is electrically closed. Conductor structure 14 which contacts launcher 30 is covered by an insulating layer before the application of metallized surface 40. In another specific embodiment, metallized surface 40 is interrupted at the point of conductor structure 14.

Figure 3:
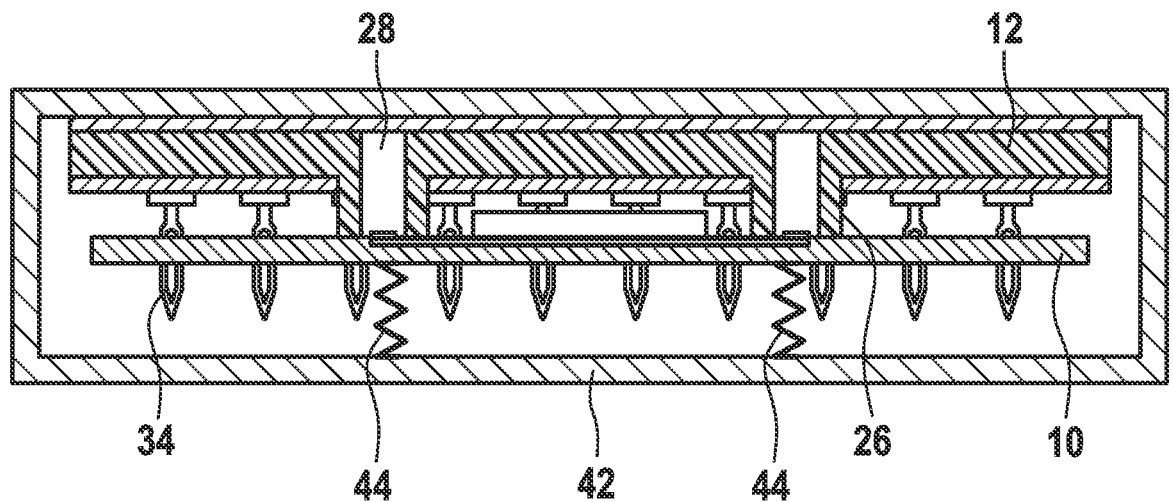
FIGS. 3 through 5 show sections through high-frequency circuits according to further exemplary embodiments of the present invention.

FIG. 3 shows a high-frequency circuit having the same fundamental structure as in FIGS. 1 and 2 together with a housing 42 in which the high-frequency circuit is accommodated. One special feature in this exemplary embodiment is that a spring 44 is situated on the underside of circuit board 10 at the point of each coupling dome 26, which supports itself on the bottom of housing 42 and pre-tensions circuit board 10 (which has a certain intrinsic elasticity) locally against the lower end face of coupling dome 26, so that a firm contact of the circuit board on the coupling dome is ensured.

Figure 4:
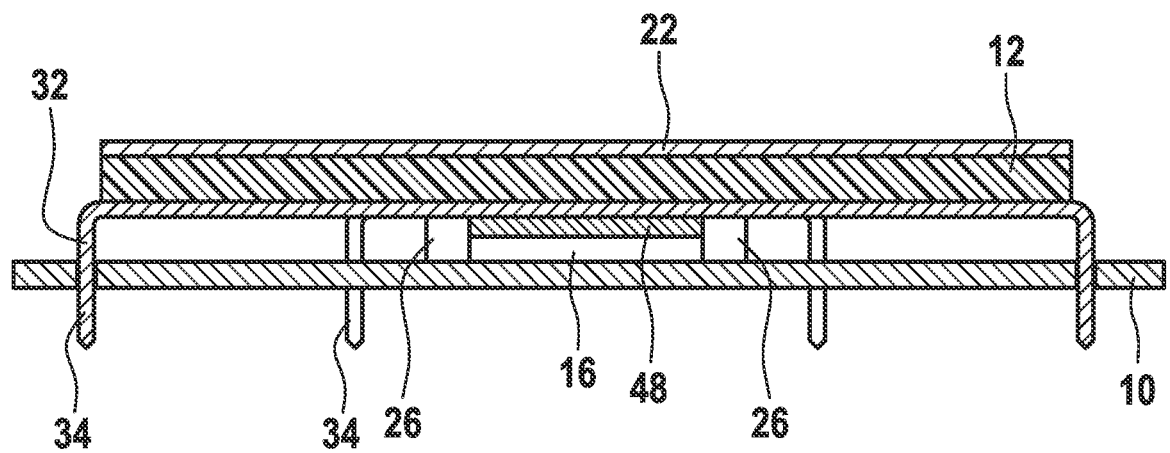

FIG. 4 shows a section through a high-frequency circuit in a sectional plane which extends at a right angle to the sectional plane in FIGS. 1 through 3, so that press-fit pins 34 are seen from the side. In this example, however, press-fit pins 34 are not only situated at the edge of the sheet-metal plate, but also within the area of the sheet-metal plate on both sides of coupling domes 26. To manufacture these inner press-fit pins 34, slots 46 (see FIG. 5) are stamped in sheet-metal plate 32 which define the outline shape of the press-fit pins.

In this exemplary embodiment, sheet-metal plate 32 is also used to dissipate the heat generated in component 16. For this purpose, the intermediate space between component 16 and sheet-metal plate 32 is filled using a thermally conductive material 48. The heat generated by component 16 may thus be dissipated via sheet-metal plate 32 and press-fit pins 34 into circuit board 10 and then discharged over a larger area.

Figure 5:
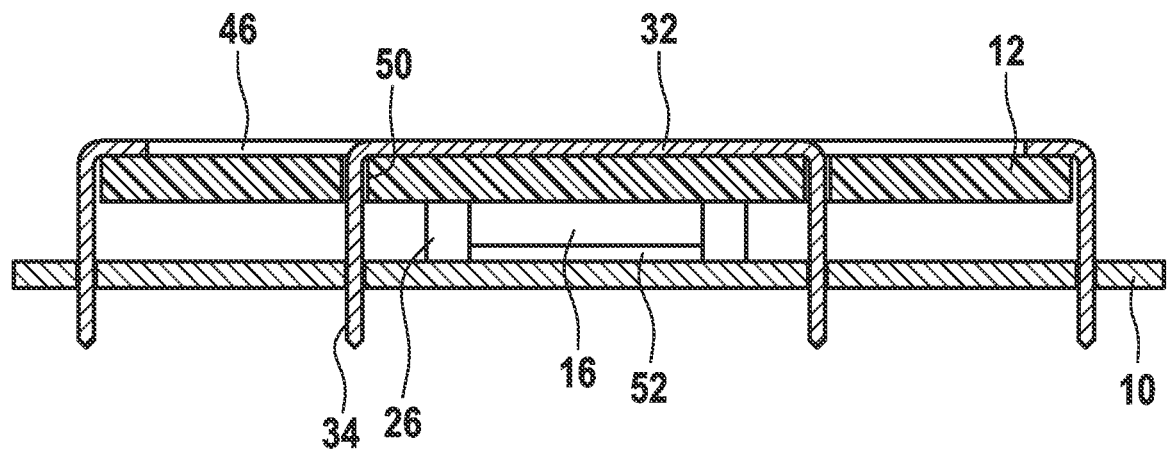

FIG. 5 shows an embodiment variant in which sheet-metal plate 32 which forms press-fit pins 34 is situated on the upper side of waveguide structure 12. Waveguide structure 12 forms passages 50 in this case, which are penetrated by inner press-fit pins 34.

In this example, a metallization layer 52, for example, made of copper, is applied on the surface of circuit board 10 on an area which contains the complete outline of component 16, which, together with the metallization of waveguide structure 12 and sheet-metal plate 32, forms an EMC shield for the high-frequency component and at the same time contributes to cooling the MMIC.

Figure 6:
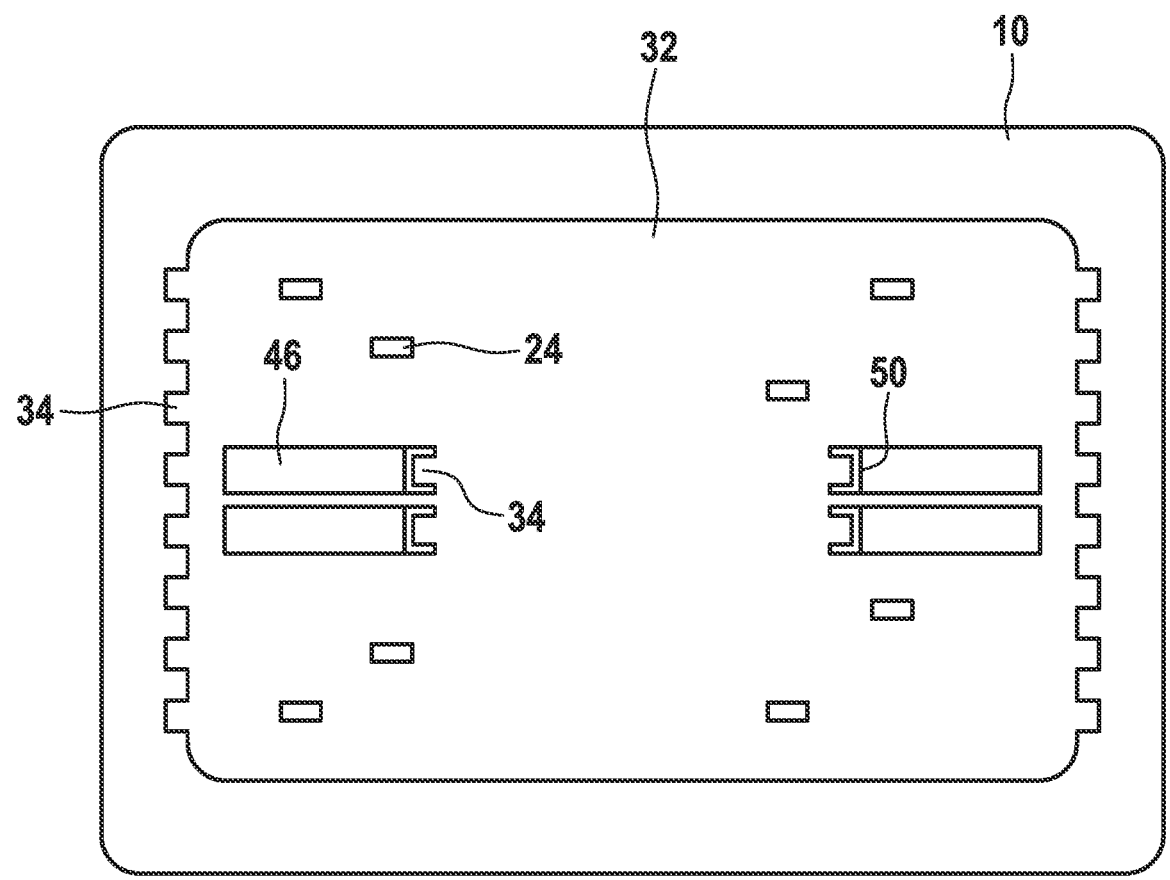
FIG. 6 shows the high-frequency circuit according to FIG. 5 in a top view.

In FIG. 6, the high-frequency circuit according to FIG. 5 is shown in a top view. The outlines of circuit board 10 and sheet-metal plate 32 and the attachments of press-fit pins 34 situated at the edge of this sheet-metal plate, as well as slots 46 in the interior of the sheet-metal plate and the attachments of press-fit pins 34 therein, which penetrate passages 50 in the waveguide structure, may be seen. Furthermore, emission openings 24 may be seen, which are formed in this case in sheet-metal plate 32 at the upper side of the waveguide structure.

In the specific embodiment according to FIGS. 5 and 6, waveguide structure 12 is built over component 16, so that the waveguide structure (with the exception of coupling domes 26) is located at a distance above circuit board 10. However, a specific embodiment is also conceivable in which the waveguide structure rests directly on circuit board 10 outside the outline of component 16. In this case, metallization layer 52 may also extend beyond the footprint of waveguide structure 12 and form the bottom of the waveguide channels.

Figure 7:
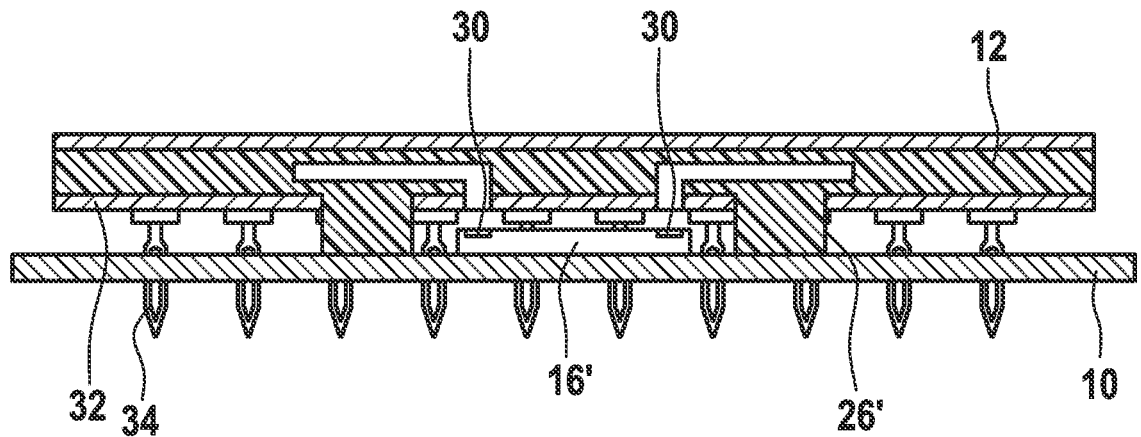
FIGS. 7 and 8 show sections through high-frequency circuits according to further exemplary embodiments of the present invention.
Figure 8:
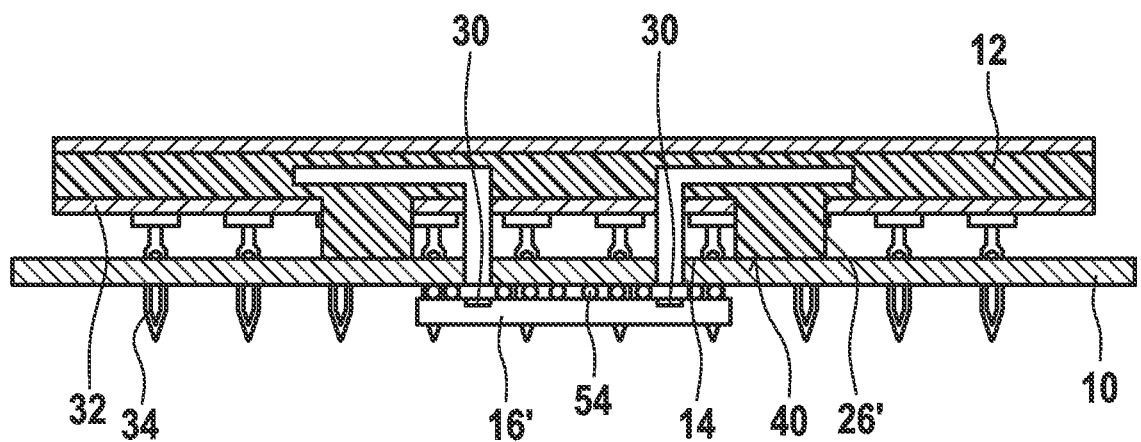
Figure 9:
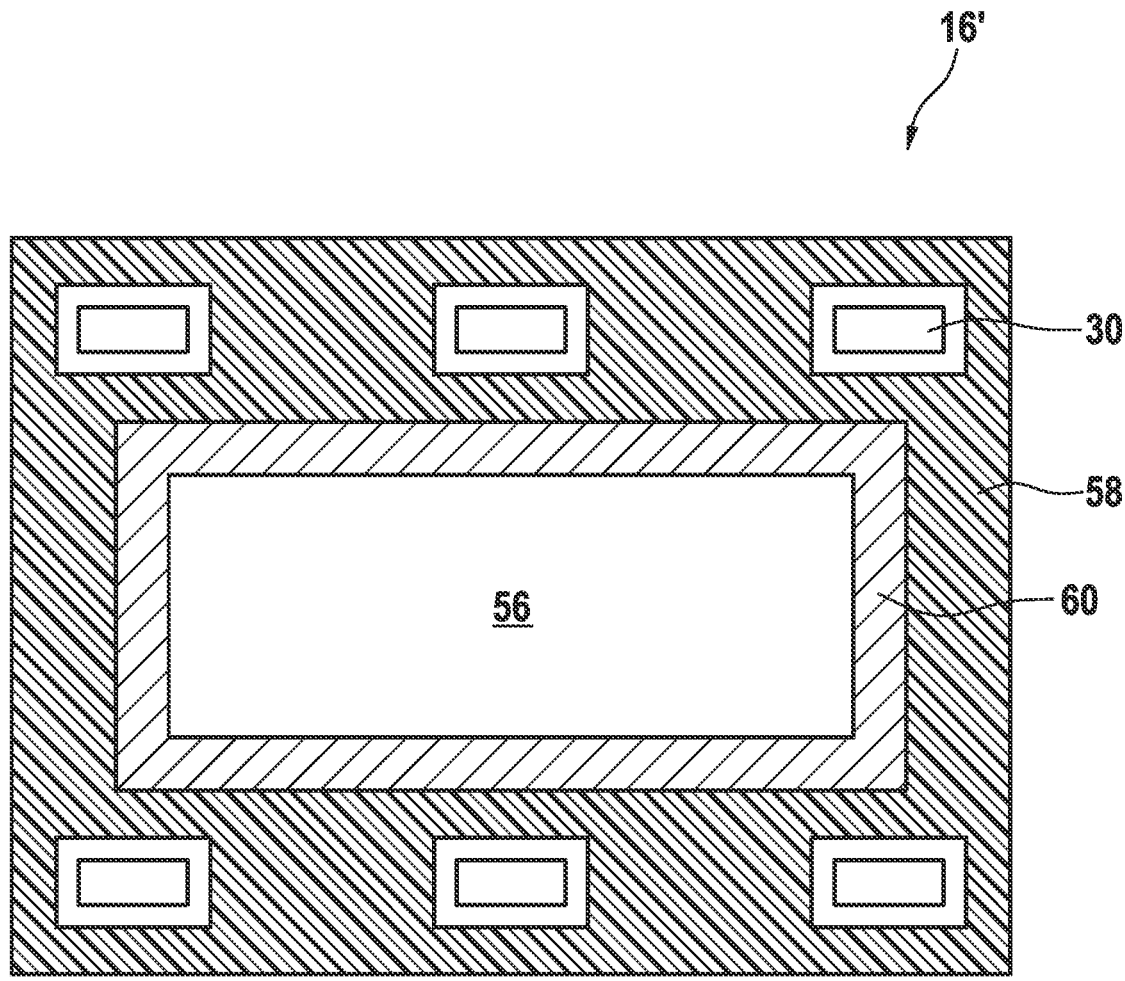
FIG. 9 shows the high-frequency circuit according to FIG. 8 in a top view.

FIGS. 7 through 9 illustrate exemplary embodiments in which launchers 30 are integrated into an electronic component 16', so that microstrip lines are not required on circuit board 10. Waveguide structure 12 includes, in place of the coupling domes, simple spacers 26', which ensure a defined distance to circuit board 10. The microwave power is coupled in from the launchers into the cavities of waveguide structure 12 directly via passages in sheet-metal plate 32.

In FIG. 7, component 16' is situated on the upper side of circuit board 10. In FIG. 8, component 16' is situated on the underside of circuit board 10 and is contacted via a ball grid array 54. In this case, the microwave power is coupled in via passages in circuit board 10.

In FIG. 9, component 16' according to FIG. 8 is shown in a top view. An MMIC 56 is embedded in a plastic cladding 58 and is in thermal contact with this cladding via a heat transfer material 60. Launchers 30 are formed on or in an outer surface of cladding 58 (launcher on package or launcher in package) and are connected via high-frequency lines (not shown) to MMIC 56.

What is claimed is:

1. A high-frequency circuit comprising:
a circuit board which bears at least one electronic component and a conductor structure; and
a waveguide structure manufactured separately from the circuit board, which is positioned on the circuit board in such a way that high-frequency signals are transferable between the conductor structure on the circuit board and the waveguide structure, wherein the waveguide structure is held on the circuit board using press-fit pins formed in one piece with a metal plate which bears the waveguide structure.

2. The high-frequency circuit as recited in claim 1, wherein the metal plate and the press-fit pins are formed from a sheet-metal plate, the press-fit pins being formed from bent strips of the sheet-metal plate.

3. The high-frequency circuit as recited in claim 2, wherein at least some of the press-fit pins are located in slots of the metal plate.

4. The high-frequency circuit as recited in claim 1, wherein channels of the waveguide structure are each delimited at least on two sides opposite to one another by metallized walls of a plastic body and the metal plate delimits the channels on one of the remaining sides.

5. The high-frequency circuit as recited in claim 4, wherein one or multiple plastic bodies which delimit the channels of the waveguide structure are situated in a sandwich-like manner between the metal plate and a further sheet-metal plate.

6. The high-frequency circuit as recited in claim 5, wherein the waveguide structure is a waveguide antenna, including emission openings in the sheet-metal plate and/or the further sheet-metal plate.

7. The high-frequency circuit as recited in claim 1, wherein the metal plate is part of an electromagnetic shield for the electronic component.

8. The high-frequency circuit as recited in claim 1, wherein the metal plate is in thermal contact with the electronic component via a heat conduction element.

9. The high-frequency circuit as recited in claim 1, wherein the metal plate is located on a side of the waveguide structure opposite to the circuit board.

10. The high-frequency circuit as recited in claim 9, wherein a metallization layer is applied to a surface of the circuit board, which extends over an entire outline of the electronic component and/or delimits wave guiding channels of the waveguide structure on one side.

11. The high-frequency circuit as recited in claim 1, wherein:
at least one of the at least one electronic component and the conductor are borne over a plane of the circuit board;
the waveguide structure forms a coupling dome in which a coupling channel extends at a right angle to the plane of the circuit board; and
a launcher extends upward from the conductor structure over the circuit board into the coupling channel.

12. The high-frequency circuit as recited in claim 11, wherein the launcher is enclosed by an annular, electrically conductive area, which extends upwards from an upper surface of the circuit board towards the waveguide structure and rests against a bottom end face of the coupling dome.

13. The high-frequency circuit as recited in claim 12, wherein the conductive area is formed by a conductive adhesive.

14. A high-frequency circuit comprising:
a circuit board which bears, over a plane of the circuit board, at least one electronic component and a conductor structure; and
a waveguide structure manufactured separately from the circuit board, which is positioned on the circuit board in such a way that high-frequency signals are transferable between the conductor structure on the circuit board and the waveguide structure;

wherein:
the waveguide structure forms a coupling dome in which a coupling channel extends at a right angle to the plane of the circuit board;
the conductor structure forms a launcher on the circuit board for the coupling channel;
the launcher is positioned inside an outline of the coupling channel; and
the circuit board is pre-tensioned locally against the coupling dome by a spring at a point of each coupling dome.

15. A high-frequency circuit comprising:
a circuit board on a plane of which at least one electronic component is arranged; and
a waveguide structure manufactured separately from the circuit board, which is positioned on, and facing the plane of, the circuit board in such a way that high-frequency signals are transferable between the electronic component and the waveguide structure;
wherein:
the waveguide structure is held on the circuit board using press-fit pins formed in one piece with a metal plate which bears the waveguide structure; and
launchers for coupling in the high-frequency signal into the waveguide structure are integrated into the electronic component with respective channels extending from the electronic component in a direction perpendicular to the plane of the circuit board towards the waveguide structure for transfer of signals of the electronic component from the launchers into the waveguide structure through the channels.

* * * * *